(12) United States Patent  
Khursheed et al.

(10) Patent No.: US 8,981,292 B2  
(45) Date of Patent: Mar. 17, 2015

(54) PARALLEL RADIAL MIRROR ANALYSER WITH AN ANGLED ZERO-VOLT EQUIPOTENTIAL EXIT GRID FOR SCANNING ELECTRON MICROSCOPES

(75) Inventors: Anjam Khursheed, Singapore (SG); Hung Quang Hoang, Esch-sur-Alzette (LU)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 14/114,170

(22) PCT Filed: Apr. 24, 2012

(86) PCT No.: PCT/SG2012/000147  
§ 371 (c)(1), (2), (4) Date: Oct. 25, 2013

(87) PCT Pub. No.: WO2012/148358  
PCT Pub. Date: Nov. 1, 2012

(65) Prior Publication Data  
US 2014/0042317 A1  Feb. 13, 2014

Related U.S. Application Data

(60) Provisional application No. 61/479,935, filed on Apr. 28, 2011.

(51) Int. Cl.  
*H01J 49/48* (2006.01)  
*H01J 37/244* (2006.01)  
(Continued)

(52) U.S. Cl.  
CPC .............. *H01J 37/261* (2013.01); *H01J 49/48* (2013.01); *H01J 49/488* (2013.01); *H01J 49/482* (2013.01);  
(Continued)

(58) Field of Classification Search  
CPC ....... H01J 49/48; H01J 49/482; H01J 49/484; H01J 49/486; H01J 49/488  
USPC ........................................................ 250/310  
See application file for complete search history.

(56) References Cited

U.S. PATENT DOCUMENTS 2,953,706 A * 9/1960 Gallet et al. .................. 313/299  
4,264,868 A * 4/1981 Leland et al. ................. 359/342  
(Continued)

OTHER PUBLICATIONS

Transmission electron microscopy 'windows' for nanofabricated structures AWGrant, Q-H Hu1 and B Kasemo2 Department of Applied Physics, Chalmers University of Technology, SE-412 96, Goteborg, Sweden Nanotechnology 15 (2004) 1175-1181.*  
(Continued)

*Primary Examiner* — Phillip A Johnston  
*Assistant Examiner* — Sean Luck  
(74) *Attorney, Agent, or Firm* — Joesph G. Chu; Vic Y. Lin; Innovation Capital Law Group, LLP

(57) ABSTRACT

A parallel radial mirror analyzer (PRMA) (700) for facilitating rotationally symmetric detection of charged particles caused by a charged beam incident on a specimen is disclosed. The PRMA comprises a zero-volt equipotential grid (728), and a plurality of electrodes (702, 704, 706, 708, 710, 712, 714, 716, 718, 720, 722) electrically configured to generate corresponding electrostatic fields for deflecting the charged particles in accordance with respective energy levels of the charged particles to exit through the grid (728) to form corresponding second-order focal points on a detector (206). The detector (206) is disposed external to the corresponding electrostatic fields. A related method is also disclosed.

11 Claims, 10 Drawing Sheets

(51) Int. Cl.
*H01J 37/28* (2006.01)
*H01J 37/26* (2006.01)
*H01J 37/05* (2006.01)
*H01J 37/22* (2006.01)

(52) U.S. Cl.
CPC .............. *H01J 49/484* (2013.01); *H01J 49/486* (2013.01); *H01J 37/05* (2013.01); *H01J 37/244* (2013.01); *H01J 37/28* (2013.01); *H01J 2237/2446* (2013.01); *H01J 2237/24485* (2013.01)
USPC ........................................................ 250/310

(56) References Cited

U.S. PATENT DOCUMENTS

| | | | | |
|---|---|---|---|---|
| 4,857,797 | A * | 8/1989 | Vrijssen et al. | 313/450 |
| 5,008,535 | A * | 4/1991 | Van Gorkom | 250/305 |
| 5,032,724 | A * | 7/1991 | Gerlach et al. | 250/305 |
| 6,762,408 | B1 * | 7/2004 | Read | 250/305 |
| 8,237,120 | B1 * | 8/2012 | Toth et al. | 250/310 |
| 2008/0197277 | A1 * | 8/2008 | Nasser-Ghodsi et al. | 250/305 |
| 2010/0155620 | A1 * | 6/2010 | Hutchison et al. | 250/440.11 |

OTHER PUBLICATIONS

International Search Report and Written Opinion (mailing date May 11, 2012) for International PCT Patent Application PCT/SG/2012/000147 filed Apr. 24, 2012.

Hoang H. Q. et al, 'A radial mirror analyzer for scanning electron/ion microscopes', Nuclear Instruments and Methods in Physics Research A (available online Feb. 1, 2011), vol. 635, pp. 64-68.

Jacka M. et al, 'Hyperbolic field electron energy analyzer with second order focusing', Review of Scientific Instruments (Oct. 2003), vol. 74, No. 10, pp. 4298-4300.

Jacka M. et al, 'A fast, parallel acquisition, electron energy analyzer: The hyperbolic field analyzer', Review of Scientific Instruments (May 1999), vol. 70, No. 5, pp. 2282-2287.

Cubric D. et al, 'Parallel acquisition electrostatic electron energy analyzers for high throughput nan-analysis', Nuclear Instruments and Methods in Physics Research A, (available online Dec. 16, 2010), vol. 645, pp. 227-233.

Jacka M. 'Scanning Auger microscopy: recent progress in data analysis and instrumentation', Journal of Electron Spectroscopy and Related Phenomena, 2001, vol. 114-116, pp. 277-282.

* cited by examiner

| Energy (eV) | Simulated % energy relative resolution | | |
|---|---|---|---|
| | Second-order focusing PRMA on detector plane ±3° angular spread | Second-order focusing PRMA on intrinsic plane ±3° angular spread | Previous HFA design ±3° angular spread | Previous HFA design ±1° angular spread |
| 100 | 0.647 | 0.381 | 1.685 | 0.591 |
| 200 | 0.313 | 0.200 | 2.197 | 0.586 |
| 500 | 0.185 | 0.126 | 2.246 | 0.470 |
| 1000 | 0.145 | 0.120 | 1.852 | 0.332 |
| 2000 | 0.144 | 0.120 | 1.63 | 0.252 |
| 3000 | 0.133 | 0.109 | 1.497 | 0.212 |
| 5000 | 0.120 | 0.116 | 1.337 | 0.171 |

PARALLEL RADIAL MIRROR ANALYSER WITH AN ANGLED ZERO-VOLT EQUIPOTENTIAL EXIT GRID FOR SCANNING ELECTRON MICROSCOPES

FIELD

The present invention relates to a parallel radial mirror analyser for scanning microscopes, which include scanning electron/ion microscopes.

BACKGROUND

The potential advantages of using wide-range parallel energy detection of charged particles to speed up spectrometer data acquisition times are well known, and documented in the following citations: [1]. M. Jacka, M. Kirk, M. M. El Gomati, M. Prutton, Rev. Sci. Instrum. 70 (5) (1999) 2282-2287, [2]. M. Jacka, A. Kale, N. Traitler, Rev. Sci. Instrum. 74(10) (2003) 4298-4300, and [3]. M. Jacka, J. Electron. Spectrosc. Relat. Phenom. 114-116 (2001) 277-282. One class of parallel analyzer designs is based upon the Hyperbolic Field Analyser (HFA), which has also been developed into an Auger Electron Spectroscopy (AES) attachment for Scanning Electron Microscopes (SEMs) to be used in combination with a low voltage Argon ion source. In particular, the entire Auger electron spectrum from the HFA may be captured within one/two seconds after a surface of a specimen (under examination) has been cleaned by the ion gun, before any appreciable hydrocarbon contamination is allowed to form. Also, use of the HFA opens up a possibility of performing AES at high vacuum pressures, instead of at Ultra High Vacuum (UHV) conditions which is typically done. Thus, performing AES with SEMs allows mapping of elemental information on a nano-scale to be feasible.

One problem with analysers based on existing HFA design is that they suffer from relatively low transmittance. Even with improvements, the overall transmittance is still typically around 100 times smaller than that of the Cylindrical Mirror Analyser (CMA) at comparable energy resolutions. The relatively low transmittance is mainly due to the HFA designs being characterised by first-order focusing properties on the detector plane, limiting the angular spread in the plane of deflection to fairly small values, typically less than ±1.2°. Further, conventional HFA designs are also planar in geometry implying that the electrons may only be detected over a narrow out-of-plane angular range, typically less than ±2.5°.

One object of the present invention is therefore to address at least one of the problems of the prior art and/or to provide a choice that is useful in the art.

SUMMARY

According to a $1^{st}$ aspect of the invention, there is provided a parallel radial mirror analyser (PRMA) for facilitating rotationally symmetric detection of charged particles caused by a charged beam incident on a specimen. The PRMA comprises a zero-volt equipotential grid, and a plurality of electrodes electrically configured to generate corresponding electrostatic fields for deflecting the charged particles in accordance with respective energy levels of the charged particles to exit through the grid to form corresponding second-order focal points on a detector. The detector is disposed external to the corresponding electrostatic fields.

Advantages of the PRMA may include having full rotational symmetric detection capability with respect to a primary beam axis directed at a specimen being examined, meaning that the out-of-plane angular direction of detection of the electrons/ions scattered from the specimen is 360°. In addition, the range of energies detectable by the PRMA may vary by a factor of over fifty from 100 eV to 5000 eV, and may advantageously have second-order focusing properties for all of the detected electrons/ions for achieving an energy resolution of better than 0.2% for an in-plane angular spread of ±3° for most of the energy range. Further, the PRMA may have a transmittance of an order of magnitude better than existing wide-range parallel energy analyzer designs.

In summary, in the PRMA as proposed, the voltages applied to the electrodes are not chosen to reproduce electrostatic field having parabolic distribution, and with this freedom, in terms of being able to select from a wider set of voltages, it has been determined via simulations that the PRMA is consequently able to achieve rotational symmetric detection/collection over a full 360° angle in the out-plane direction (i.e. azimuthal angular direction), and also attain second-order focusing. Further, the design of the PRMA is such that a high transparency grid is used and arranged on the bottom plane of the PRMA, and the detector plane is correspondingly located in a field-free region below the PRMA.

Preferably, an angle of the grid through the PRMA may be lowered to approximately 17° relative to a bottom plane of the PRMA. In addition, the PRMA may be configured to be mounted to a scanning electron/ion microscope. Yet further, the field strength of the electrostatic fields may also be configured to enable deflection of the charged particles having an in-plane angular spread of ±3° relative to adjacent charged particles of a similar energy level exiting the grid.

Moreover, the plurality of electrodes may preferably be respectively configured with voltages of −17 V, −88.1 V, −208.3 V, −320.4 V, −480.6 V, −688.9 V, −929.2 V, −1249.6 V, −1441.8 V, −1521.9 V, −1762.2 V, and −2643 V.

More preferably, the PRMA may include the detector, which may also be arranged around an axis of the charged beam to enable detection of the charged particles omnidirectionally. Moreover, the field strength of the electrostatic fields may be configured to achieve an energy resolution of better than 0.2% for an in-plane angular spread of ±3° for a majority of the energy range. Additionally, the grid may have a grid transparency of greater than 90%.

According to a $2^{nd}$ aspect of the invention, there is provided a parallel radial mirror analyser (PRMA) for facilitating rotationally symmetric detection of charged particles caused by a charged beam incident on a specimen. The PRMA comprises a plurality of electrodes electrically configured to generate corresponding electrostatic fields for deflecting the charged particles in accordance with respective energy levels of the charged particles to form corresponding first-order focal points on a zero-volt equipotential detector.

Yet preferably, the plurality of electrodes may be respectively configured with voltages of −45 V, −120 V, −285 V, −775 V, −1150 V, −1675 V, and −2020 V. Moreover, the PRMA may be configured to be mounted to a scanning electron/ion microscope, and may also include the detector. The field strength of the electrostatic fields may be configured to enable deflection of the charged particles having an in-plane angular spread of ±1.1° relative to adjacent charged particles of a similar energy level. Also, the detector may be arranged around an axis of the charged beam to enable detection of the charged particles omnidirectionally.

According to a $3^{rd}$ aspect of the invention, there is provided a method of detecting charged particles caused by an electron beam incident on a specimen using the PRMA according to the $1^{st}$ aspect of the invention. The method comprises receiving the charged particles, generating the corresponding electrostatic fields to deflect the charged particles to exit through the grid, and detecting the corresponding second-order focal points formed by the exiting charged particles on the detector.

It should be apparent that features relating to one aspect of the invention may also be applicable to the other aspects of the invention.

These and other aspects of the invention will be apparent from and elucidated with reference to the embodiments described hereinafter.

BRIEF DESCRIPTION OF THE DRAWINGS

Embodiments of the invention are disclosed hereinafter with reference to the accompanying drawings, in which:

FIG. 7 is a table comparing simulated energy resolutions of the second-order focusing PRMA of FIG. 5a with the ideal HFA.

DETAILED DESCRIPTION OF PREFERRED EMBODIMENTS

Figure 1:
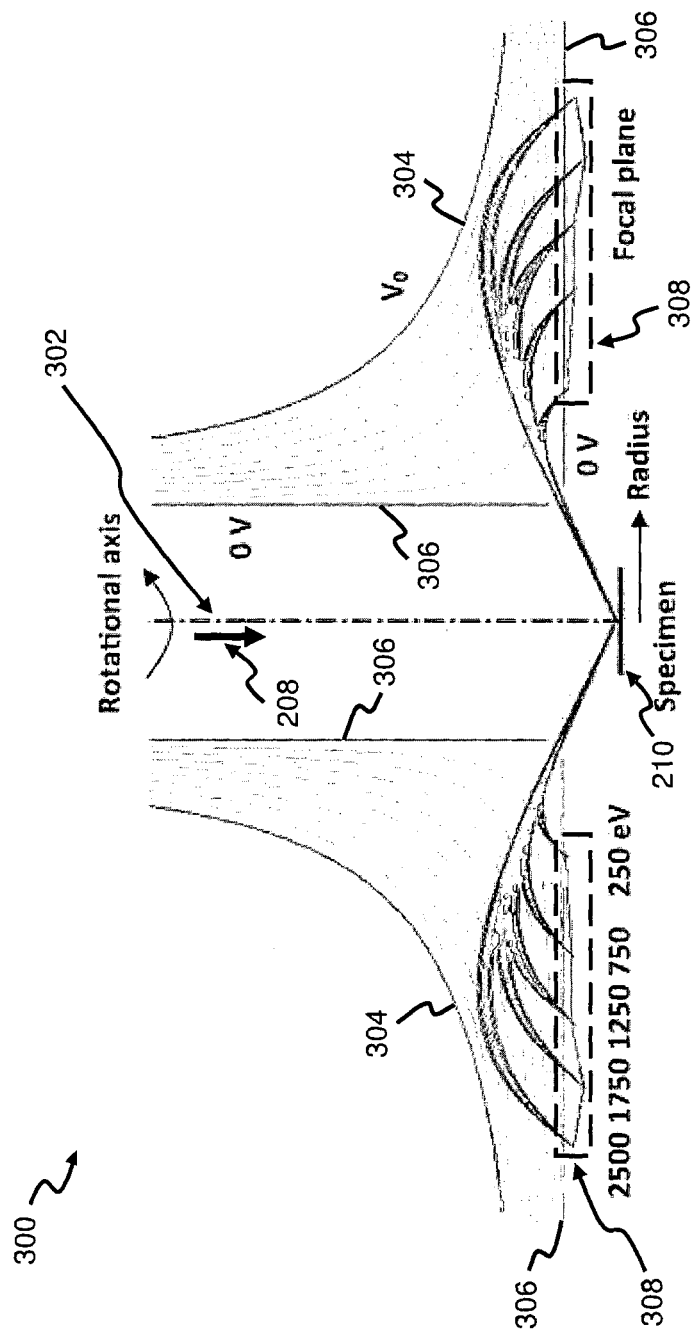
FIG. 1 shows simulated paths of electron rays in an ideal HFA layout being transformed into axi-symmetric cylindrical coordinates.

An initial step for obtaining a first-order focusing PRMA (from a conventional HFA) is that the electrodes layout of an ideal HFA is adopted and mapped into a rotational symmetric geometry (under an axi-symmetric coordinate system) as shown in FIG. 1, in which the axis of rotational symmetry 302 of the scattered electrons rays (from a specimen 210) is arranged to be a primary electron beam (hereinafter primary beam) 208. The primary beam 208 is directed at and incident on the specimen 210 being examined, which is positioned on its horizontal plane and located below an electron/ion beam column 202 (i.e. see FIG. 2). The electron/ion beam column 202 is hereinafter termed as the beam column 202, and it facilitates the application of the primary beam 208 onto the specimen 210. In particular, the specimen 210 has an axis of rotation about the primary beam 208. In the new axi-symmetric coordinate system, a pair of hyperbolic equipotential boundaries 304 (and being mirror reflections of each other), which is configured to be at −1500 Volts for $R_0$=2 cm (based on the ideal HFA in accordance with equation (1), which analytically describes the potential field distribution to be generated in the HFA:

$$V(x, y) = \frac{2V_0}{R_0^2}xy), \quad (1)$$

is ascertained to be a fixed boundary condition, with a pair of zero equipotential boundaries 306 located on each side of the axis of rotational symmetry 302 maintaining their relative positions opposite to each hyperbolic equipotential boundary 304. Each pair of zero equipotential boundaries 306 comprises a vertical and a horizontal equipotential boundary. The resulting electrostatic field distributions located in between the equipotential boundaries 304, 306 is subsequently numerically solved via simulations using the Lorentz-2EM™ software (or any equivalent similar software) to obtain the specific field lines values, with the origin coordinate of the axi-symmetric coordinate system defined to be at the centre of the specimen 210. Importantly, the accuracy of all the simulations were continually checked and verified by repeating the results through using smaller boundary segments and trajectory step sizes to ensure that important ray tracing parameters such as the final focal spot-size of an electron beam exiting the HFA do not change significantly (i.e. having a deviation of less than 1%).

Referring again to FIG. 1, it shows a plot of simulated paths of electrons rays for respective energies of 250 eV, 750 eV, 1250 eV, 1750 eV, and 2500 eV, within the context of the transformed rotationally symmetric geometry. Particularly, FIG. 1 indicates that the trajectory paths of the simulated electrons rays are no longer focusable onto a horizontal plane (i.e. a detector plane), as evident from the out-of-focus focusing points 308 of the respective electrons rays when they land on a focal plane (i.e. the horizontal plane). However, the electrode layout of the ideal HFA is not preferred for realising a first-order focusing PRMA with rotationally symmetric structure.

Figure 2:
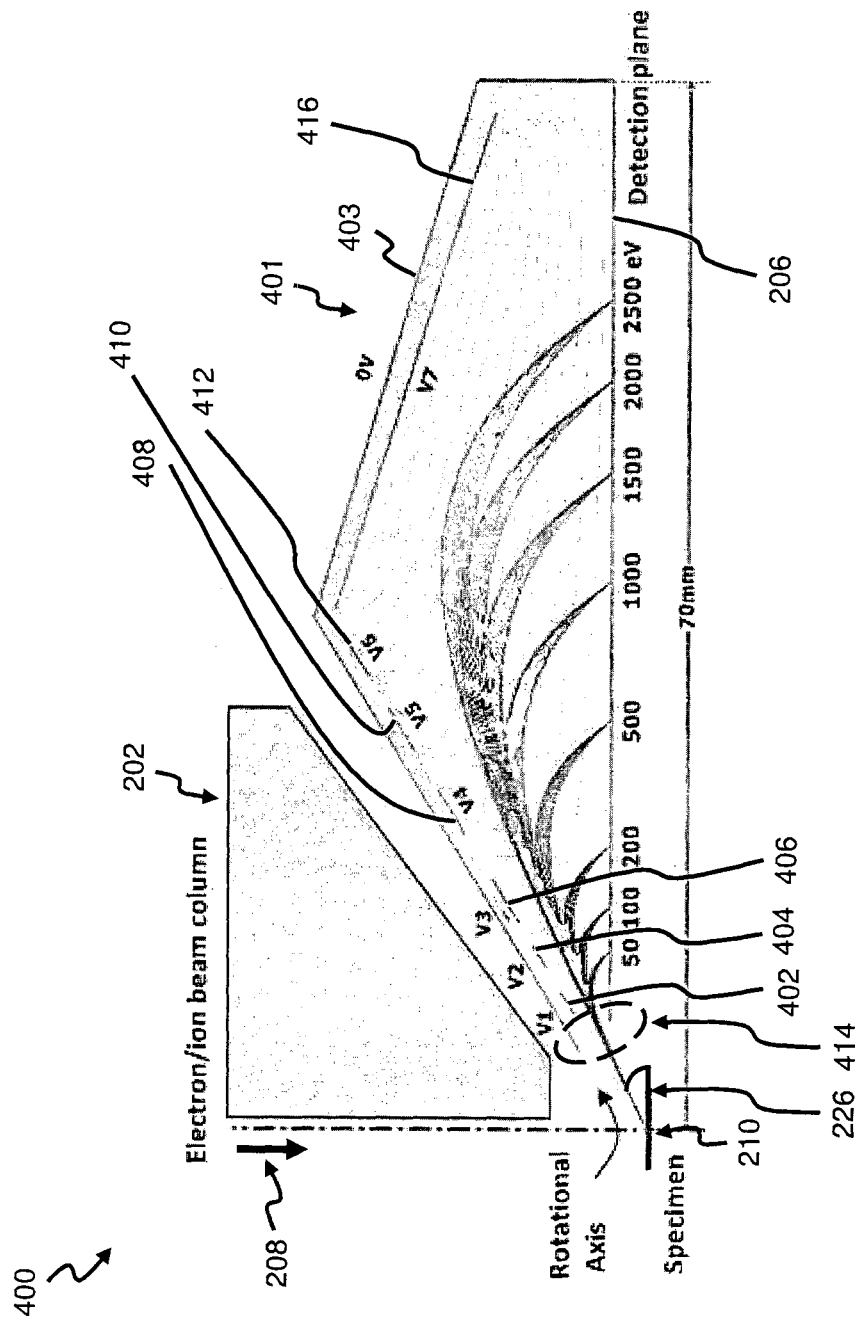
FIG. 2 is a schematic diagram of simulated trajectory paths of electron rays through a first-order focusing Parallel Radial Mirror Analyser (PRMA), according to a first embodiment of the invention.

According to a first embodiment, FIG. 2 shows a first-order focusing (and rotationally symmetric) Parallel Radial Mirror Analyser (PRMA) 400 (hereinafter first-order PRMA), which is configured as an attachment to a scanning electron/ion microscope (not shown). The first-order PRMA 400 includes an analyser 401, the beam column 202, and a detector 206. The detector 206 is positioned as a horizontal plane, and is further electrically configured with a voltage of 0 Volts to achieve a zero-volt equipotential detector. The beam column 202 is configured to have a substantially triangular-like shaped cross-section. Following on, the analyser 401 includes an outer body plate 403 (for forming the body of the analyser 401 and is electrically configured with a voltage of 0 Volts) arranged to be semi-conically shaped at a top end which extends from the body of the analyser 401. Specifically, the semi-conically shaped top end facilitates fitting of the analyser 401 under a lower pole-piece of a scanning electron/ion microscope objective lens in order to minimize the working distance (i.e. defined as the distance between the objective lens of the lower pole-piece and the specimen 210), thus allowing the scanning electron/ion microscope to operate in a high spatial resolution imaging mode. Moreover, under this arrangement, the angled face of the semi-conically shaped top end of the analyser 401 is adjacent to an oblique face of the beam column 202.

More specifically, the analyser 401 also houses a first set of six deflection (conical) electrodes 402, 404, 406, 408, 410, 412, which are respectively configured to be at corresponding potentials of $V_1$, $V_2$, $V_3$, $V_4$, $V_5$, and $V_6$. The six deflection electrodes 402, 404, 406, 408, 410, 412 are arranged to be serially attached along a conical surface of the analyser 401, which is substantially adjacent to an oblique face of the beam column 202 as afore described. Furthermore, the six deflection electrodes 402, 404, 406, 408, 410, 412 are positioned near to an entrance grid 414 where the electron rays enter the analyser 401, and are used to control the focal point positions of the electron rays of different energies. The entrance grid 414 is located at the apex of the top end and substantially in the vicinity of the specimen 210.

The first-order PRMA 400 also includes a main deflector plate 416, which is configured from only a single straight electrode (from the perspective of the cross-sectional plane orthogonal to the viewing direction of FIG. 2). The main deflector plate 416 is housed within the analyser 401, and configured with a potential of $V_7$. Additionally, the first-order PRMA 400 when being measured from the centre of the specimen 210 (when laid flat on its horizontal plane) to an end of the detector 206, which is directly below a free end of the main deflector plate 416 (not attached to the deflection electrode 412 having potential of $V_6$), has a length of approximately 70 mm. It is however to be appreciated that this length is not to be construed as limitative, and may be scalable in accordance with the specific requirements of an implementation.

It is to be noted that the initial design parameters for the potentials of the electrostatic field distribution of the first-order PRMA 400 are specified using equation (1). Further during the design phase, simulated trajectory paths of electron rays indicate that three conical electrodes (i.e. deflectors) are sufficient for providing adequate and better control of the focal points of the electron rays when they land on the detector plane 206. Moreover, continual refinements of the potentials of the deflection plates were performed during the design phase in order to obtain a satisfactory performance, in which the electron rays of different energies are required to be focused onto the detector plane 206.

When the primary beam 208 is directed onto the specimen 210, scattered electrons/ions (i.e. charged particles) then leave (i.e. bounced off) the surface of the specimen 210, enter the analyser 401 through the entrance grid 414 and are redirected/deflected downwards by the negatively biased deflection electrodes 402, 404, 406, 408, 410, 412 and main deflector plate 416, to focus at the (horizontal plane of the) detector 206. It is to be noted that the plane of the detector 206 is also known as the Gaussian focal plane. It is also to be further emphasised that a required take-off angle 226 of the electron rays from the specimen 110, with respect to the horizontal plane of the specimen 210, is defined to be "θ". The take-off angle 226 may otherwise be termed as the entrance polar angle. The focal properties of the analyser 401, position and quality of focus of the scattered electrons/ions on the detector 206, as well as the energy bandwidth, are all influenced, determined and controlled by the voltages applied to the deflection electrodes 402, 404, 406, 408, 410, 412, main deflector plate 416, and the initial take-off angle 226.

FIG. 2 also concurrently shows a plot of nine trajectories of electron rays directed through the first-order PRMA 400, in which the electron rays have energies of 50 eV, 100 eV, 200 eV, 500 eV, 1000 eV, 1500 eV, 2000 eV, and 2500 eV respectively over a polar angular spread of ±1.1° around a central angle of 24.8°, and the equipotentials are configured in uniform steps of 135 Volts, ranging from 0 Volts to −2020 Volts. The angular spread is defined to be the angular separation between adjacent scattered electrons/ions of a similar energy level (i.e. from a perspective that the scattered electrons/ions are viewed as electrons/ions rays with travelling paths). More specifically, the voltages of the first set of deflection electrodes 402, 404, 406, 408, 410, 412, and the main deflector plate 416 are configured with the following respective values (measured in Volts): $V_1=-45$, $V_2=-120$, $V_3=-285$, $V_4=-775$, $V_5=-1150$, $V_6=-1675$, and, $V_7=-2020$.

It is to be emphasised that each of the voltages $V_1$ to $V_7$ are systematically adjusted in order to focus the electron rays onto the plane of the detector 206, with the adjustment being performed starting from the lower energies range (in terms of the electron rays). Furthermore, the functions of each deflection electrode 402, 404, 406, 408, 410, 412, and the main deflector plate 416 are characterised as follow: the voltages $V_1$ and $V_2$ are for controlling the focal point positions of electron rays residing in the lower energy range (i.e. 0 eV to 200 eV), while the voltages $V_3$ to $V_5$ are for controlling the focal point positions of electron rays in the middle energy range (i.e. 200 eV to 1500 eV), whereas $V_5$ and $V_6$ control the focal point positions electron rays belonging to higher energy range (i.e. 1500 eV to 2500 eV). Although the voltage $V_3$ also has effects on the focal point positions of electron rays in the lower energy range, those effects are easily compensated by altering the voltage $V_2$. Lastly, the voltage $V_7$ affects the horizontal shifting of the focal point positions. Separately, although the voltage $V_1$ affects the focusing of electron rays of the entire energy range, such effects diminish as the energy of the electron rays increases. Moreover, since only small changes in the voltage $V_1$ are required for controlling the focal point positions of electron rays in the lower energy range, the effect of those small changes are therefore negligible on electron rays with higher energies.

Figure 3:
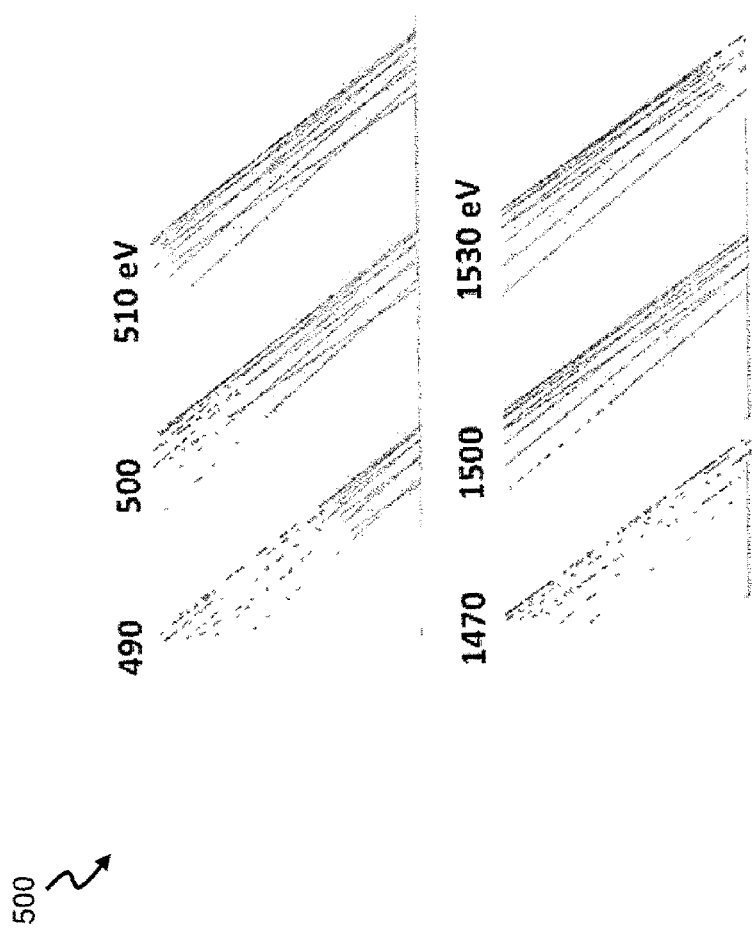
FIG. 3 shows spot size characteristics of the first-order focusing PRMA of FIG. 2, in which paths of electron rays at the Gaussian focal plane for ±2% energies around the central energies of 500 eV, and 1500 eV are depicted.

Following on, FIG. 3 depicts simulated paths of electron rays around the (Gaussian) plane of the detector 206 in the first-order PRMA 400 relating to electron energies of ±2% around the central energies of 500 eV and 1500 eV (over a polar angular spread of ±1.1°). A visual estimate, as performed on FIG. 3, puts the relative energy resolution capability of the first-order PRMA 400 of the focusing (i.e. the half trace-width) to be in the range of 0.25% to 0.3% (which is a measure of the deviation/uncertainty in energy as a fraction of its past energy, as known to skilled persons).

Figure 4:
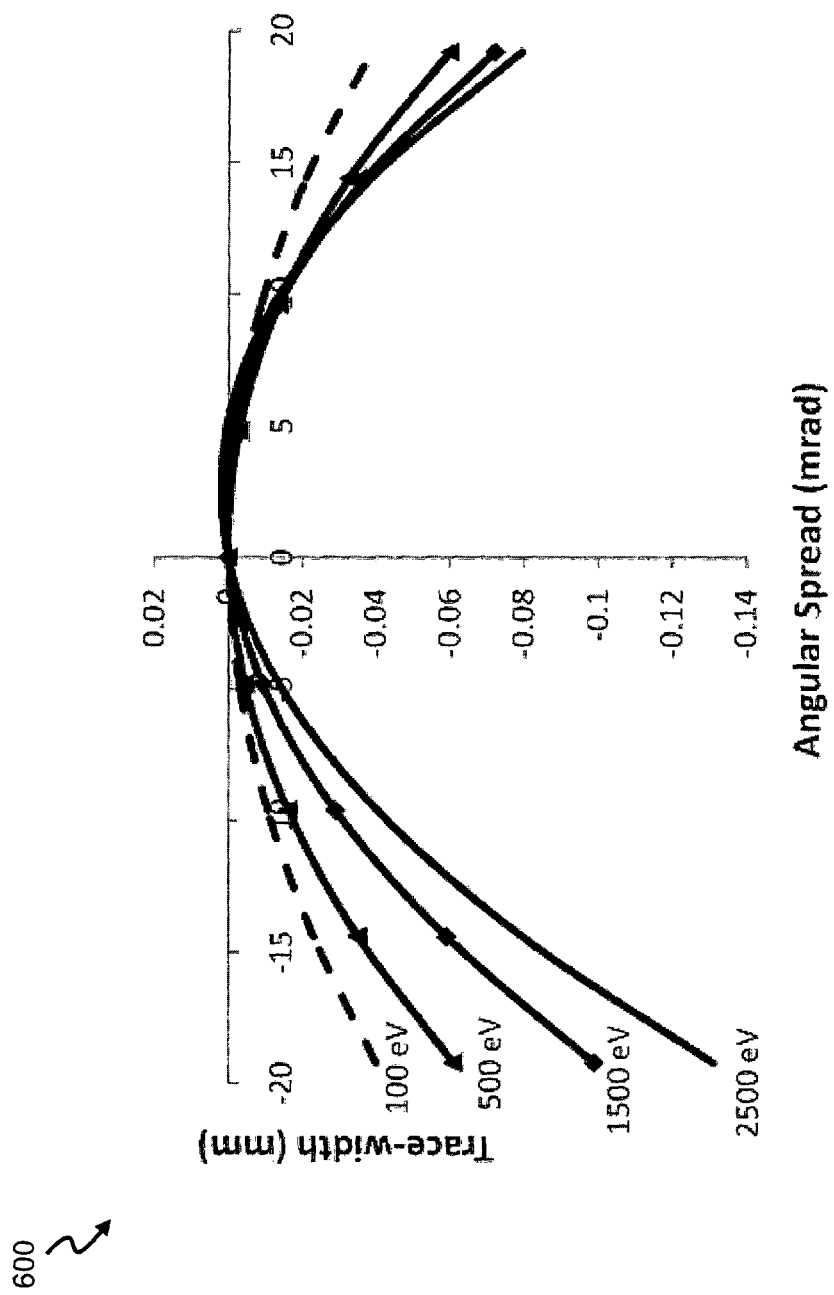
FIG. 4 shows spot size characteristics of the first-order focusing PRMA of FIG. 2, in which a plot of trace-width as a function of input polar angular spread, at selective energies is depicted.

FIG. 4 then shows a plot 600 of trace-width (measured in millimeter, i.e. "mm") as a function of input polar angular spread (measured in milliradians, i.e. "mrad") ranging from −20 mrad (−1.145°) to +20 mrad (+1.145°) at selective energies. The parabolic nature of the curves in the plot 600 indicates that the first-order PRMA 400 possesses first-order focusing properties (i.e. second-order geometrical aberration) across its entire detected energy range, which is in accordance with the results shown in FIG. 3.

Further embodiments of the invention will be described hereinafter. For the sake of brevity, description of like elements, functionalities and operations that are common between the embodiments are not repeated; reference will instead be made to similar parts of the relevant embodiment(s).

Figure 5A:
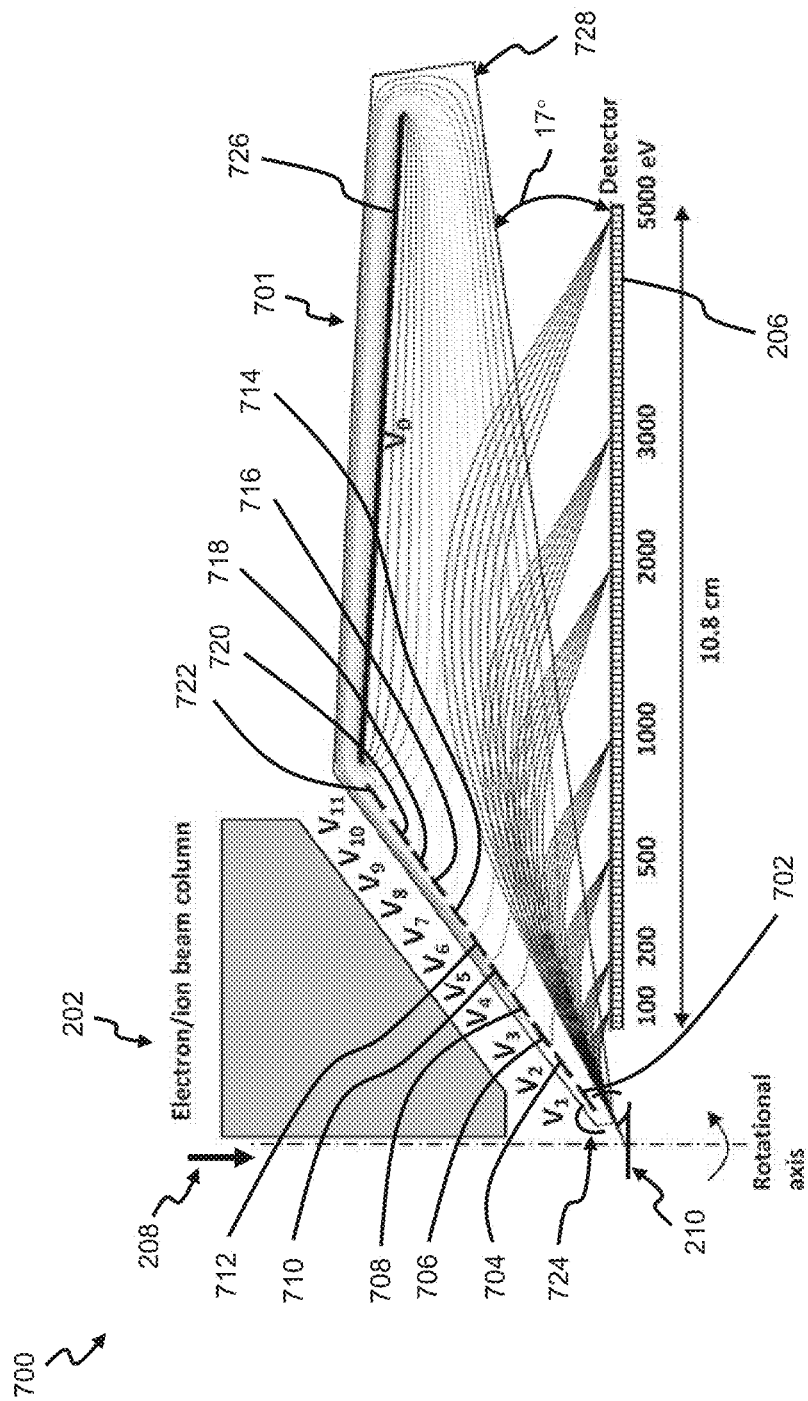
FIG. 5a is a schematic diagram of simulated trajectory paths of electron rays through a second-order focusing PRMA, according to a second embodiment of the invention.
Figure 5B:
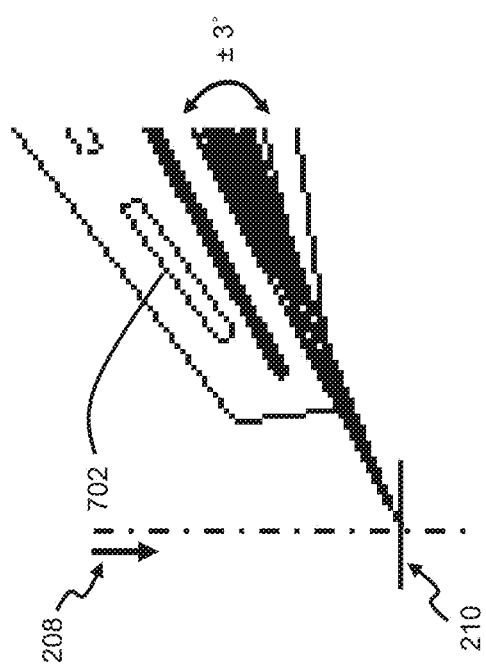
FIG. 5b is a magnified view of a section in FIG. 5a, in which a region around the specimen and the entrance of the PRMA indicating the entrance angular spread of electrons captured by the PRMA is depicted.

FIG. 5a illustrates a second-order focusing (and rotationally symmetric) Parallel Radial Mirror Analyser (PRMA) 700 (hereinafter second-order PRMA), according to a second embodiment. In particular, the second-order PRMA 700 is derived from the first-order PRMA 400 of FIG. 2 to obtain second-order focusing properties, but distinguishes from the latter by extending the number of electrodes (housed within an analyser 701) in a first set of deflection electrodes 702, 704, 706, 708, 710, 712, 714, 716, 718, 720, 722 to eleven (as opposed to only six used in the first-order PRMA 400). Each deflection electrode 702, 704, 706, 708, 710, 712, 714, 716, 718, 720, 722 is in turn configured with respective potentials of $V_1, V_2, V_3, V_4, V_5, V_6, V_7, V_8, V_9, V_{10}$, and $V_{11}$. The reason for adopting more deflection electrodes is because it has been determined (via simulations) that it is necessary to position more electrodes near to an entrance grid 724 (of the second-order PRMA 700) in order to minimize any height fluctuations of the focal points of the electron rays along the (focal) plane of the detector 206. The entrance grid 724 is electrically configured with a voltage of 0 Volts. Furthermore, the plane of the detector 206 has also been increased to around 108 mm long. The second order PRMA 700 is also configured with a main deflector plate 726, which is similar (geometry and functionality) to the one in the first-order PRMA 400, except that the length has been increased further.

Another deviation of the second-order PRMA 700 from the first-order PRMA 400 is that a zero-volt equipotential exit grid 728 is now positioned at an angle in between the analyser 701 and the plane of detector 206. More specifically, the exit grid 728 is arranged such that the angle through the PRMA 400 (relative to the PRMA 400 bottom plane) is lowered, to typically around 17°, in order to extend the exit focal points to a field-free region below the PRMA 400 bottom plane (i.e. the plane of the detector 206). In addition, the exit grid 728 is electrically configured with a voltage of 0 Volts. In other words, the detector 206 in this embodiment is located in a field-free region (i.e. disposed external to the electrostatic field generated by the deflection electrodes 702, 704, 706, 708, 710, 712, 714, 716, 718, 720, 722 and main deflector plate 726). The voltages of the deflection electrodes 702, 704, 706, 708, 710, 712, 714, 716, 718, 720, 722 are also adjustable for focusing the scattered electrons onto the detector 206. Further, FIG. 5a shows seven trajectories of electron rays with different energies plotted evenly between −3° and 3° at around a polar entrance angle of 24.6°.

Furthermore, the detector 206 in the second-order PRMA 700 is not configured with a voltage of 0 Volts, unlike the case in the first-order PRMA 400.

In this instance, the main deflector plate 726 and deflection electrodes 702, 704, 706, 708, 710, 712, 714, 716, 718, 720, 722 are respectively configured with the following potential values (in Volts): $V_D$=−2643, $V_1$=−17, $V_2$=−88.1, $V_3$=−208.3, $V_4$=−320.4, $V_5$=−480.6, $V_6$=−688.9, $V_7$=−929.2, $V_8$=−1249.6, $V_9$=−1441.8, $V_{10}$=−1521.9, and $V_{11}$=−1762.2. More specifically, the electricity field distribution in the second-order PRMA 700 is adjusted to redirect the scattered electrons downwards onto the plane of the detector 206 which is accordingly achieved by systematically altering the potentials $V_1$ to $V_{11}$, starting from the lower energies range (in terms of the electron rays), in a manner similar to that previously described for the first-order PRMA 400 of FIG. 2. It is however to be emphasised that the required voltage variations applied to the deflection electrodes for transforming the analyser design to be rotationally symmetric are typically much smaller than those required to achieve second-order focusing. In contrast, in relation to the geometry of the second-order PRMA 700, the potential values of the deflection electrodes 702, 704, 706, 708, 710, 712, 714, 716, 718, 720, 722 for both a planar and a rotationally geometry remain substantially the same. The only difference between the two geometries is that the height of the focal plane (which is approximately planar) differs slightly by less than 200 μm.

Figure 6A:
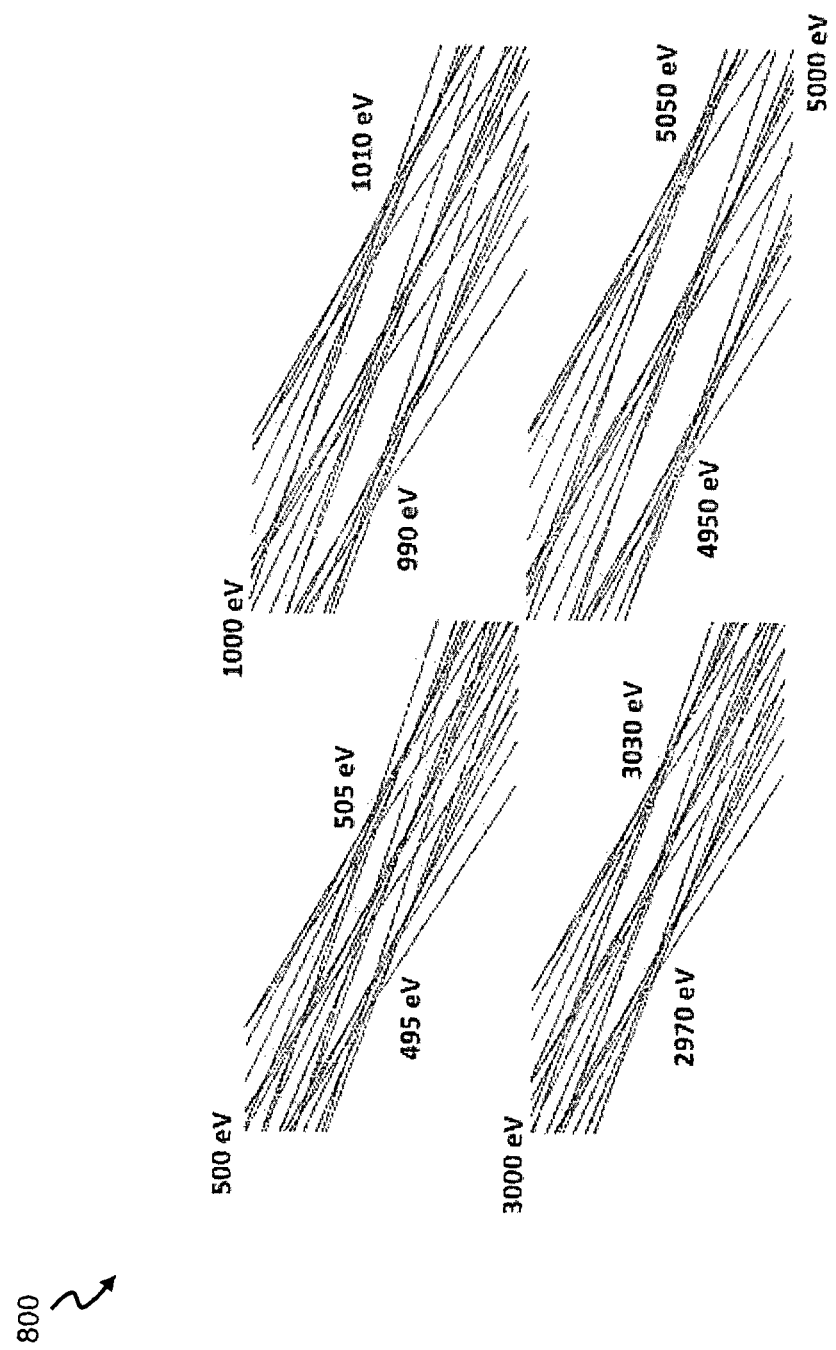
FIG. 6a shows spot size characteristics of the second-order focusing PRMA of FIG. 5a, in which paths of electron rays at the Gaussian focal plane for ±1% energies below and above the central energies of 500 eV, 1000 eV, 3000 eV, and 5000 eV are depicted.
Figure 6B:
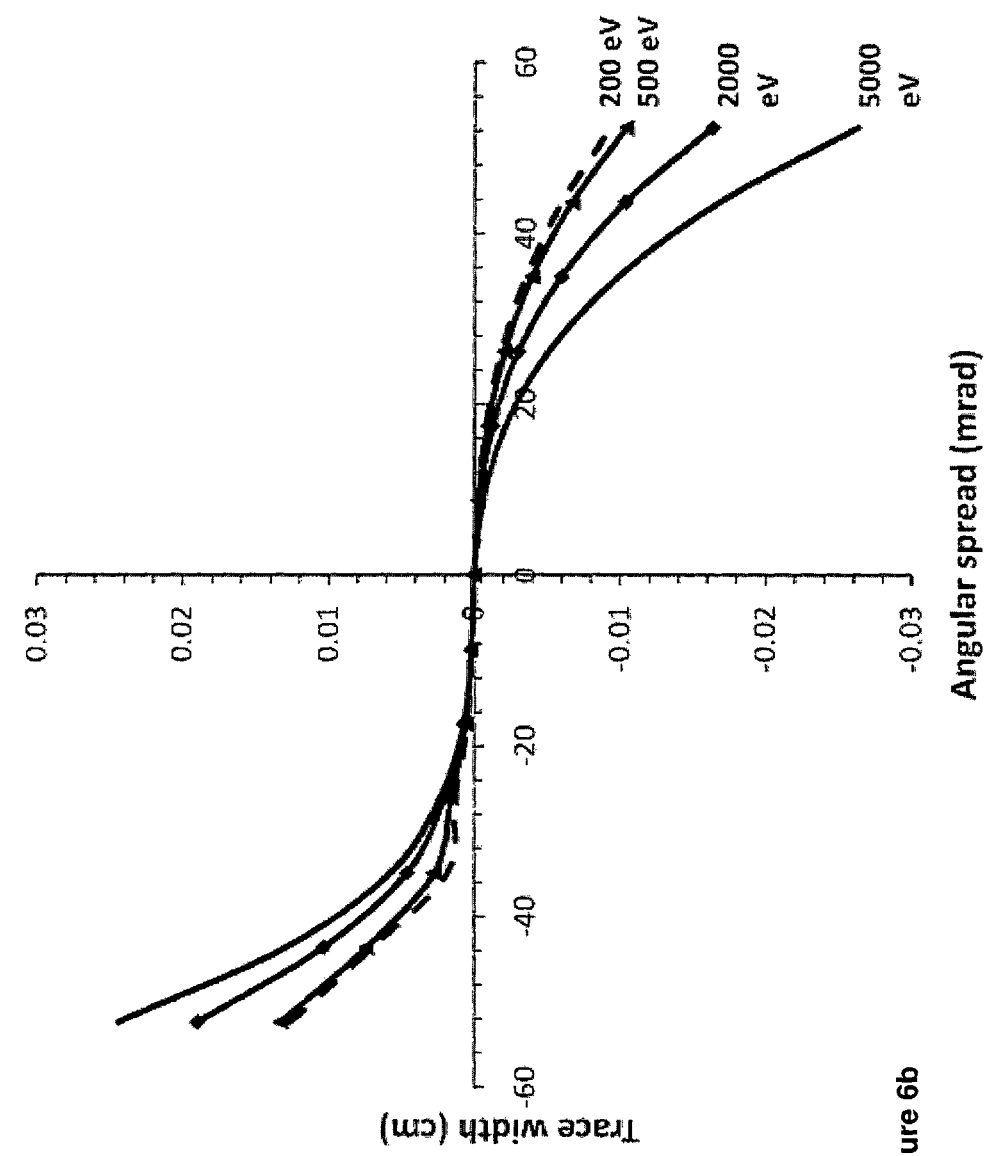
FIG. 6b shows spot size characteristics of the second-order focusing PRMA of FIG. 5a, in which a plot of trace-width as a function of input polar angular spread, at selective energies is depicted.

FIG. 6 shows simulated electron rays characteristics of the second-order PRMA 700 around the plane of the detector 206 at selected energies for an angular spread of ±3°, and in uniform steps of 1°. In detail, FIG. 6a depicts paths of the electron rays around the detector 206 at energies of 1% below and above the central energies (of 500 eV, 1000 eV, 3000 eV, and 5000 eV), and the results indicate that the energy resolution (corresponding to the half-width of the central ray) of the second-order PRMA 700 lies well below 0.2% for a wide range of energies. On the other hand, FIG. 6b illustrates a plot of (simulated) trace-width as a function of input polar angular spread on the Gaussian focal plane, which confirms that the second-order PRMA 700 indeed has second-order focusing properties (i.e. third-order geometrical aberration trace-width shape), based on the hyperbolic nature of the curves, over the entire electron energy range to be detected.

A table 900 in FIG. 7 compares simulated energy resolutions of the second-order PRMA 700 against the ideal HFA. Particularly, the polar angular spread is specified to be ±3° for the second-order PRMA 700, while polar angular spreads of ±3° and ±1° respectively are specified for the HFA. Accordingly, the results in table 900 show that the energy resolution does not degrade significantly by detecting electrons on a horizontal detector plane, since it is known that if detection is performed on a plane that is slightly inclined from a horizontal plane, then the corresponding energy resolutions achieved are higher, and vice-versa. In this embodiment, the energy resolutions being sacrificed in order to do detection on a horizontal detector plane therefore do not suffer as badly as envisaged, based on the results obtained. In addition, the energy resolution of the second-order PRMA 700 is determined (through simulations) to be approximately an order of magnitude better than the conventional HFA for most of the detected electron energy range (i.e. between 100 eV to 5000 eV). Correspondingly, this translates into a transmittance advantage, in which for the same simulated energy resolution (i.e. refer to first and last column of the results in the table 900 of FIG. 7), the second-order PRMA 700 has approximately three times more transmittance in the polar angular direction. Consequently, this when coupled with an improvement of more than a factor of fifty in the out-of-plane direction (i.e. possessing a full 360° electrons detection capability in the azimuthal angle compared to an acute angle of ±2.5° detection capability for the conventional HFA) provides the second-order PRMA 700 with a total transmittance of (more than) two orders of magnitude higher than existing HFA designs. The out-of-plane direction (i.e. azimuthal angular direction) is defined as a plane in which the electrons (i.e. charged particles) are not deflected by the electrostatic fields generated by the deflection electrodes 702, 704, 706, 708, 710, 712, 714, 716, 718, 720, 722, wherein the plane is viewed from a top plane perspective of the second-order PRMA 700.

It is to be appreciated that the energy range detectable by the second-order PRMA 700 is easily reconfigurable by appropriately scaling (i.e. linearly varying) the voltages applied to the deflection electrodes 702, 704, 706, 708, 710, 712, 714, 716, 718, 720, 722. For example, the current 100 eV to 5000 eV energy range may be mapped to a new 50 eV to 2500 eV energy range by downscaling all voltages of the deflection electrodes 702, 704, 706, 708, 710, 712, 714, 716, 718, 720, 722 by a similar factor (i.e. a factor of two). In addition, the focal points of the respective electron rays are the same before and after scaling is applied (if necessary based on an application). For instance, the 50 eV energised electrons land on a position on the plane of the detector 206 after scaling, which is approximately the same at where the 100 eV energised electrons land before scaling is applied. Nonetheless, the relative energy resolution of the second-order PRMA 700 for the same position on the plane of the detector 206 remains the same despite the scaling.

Figure 8:
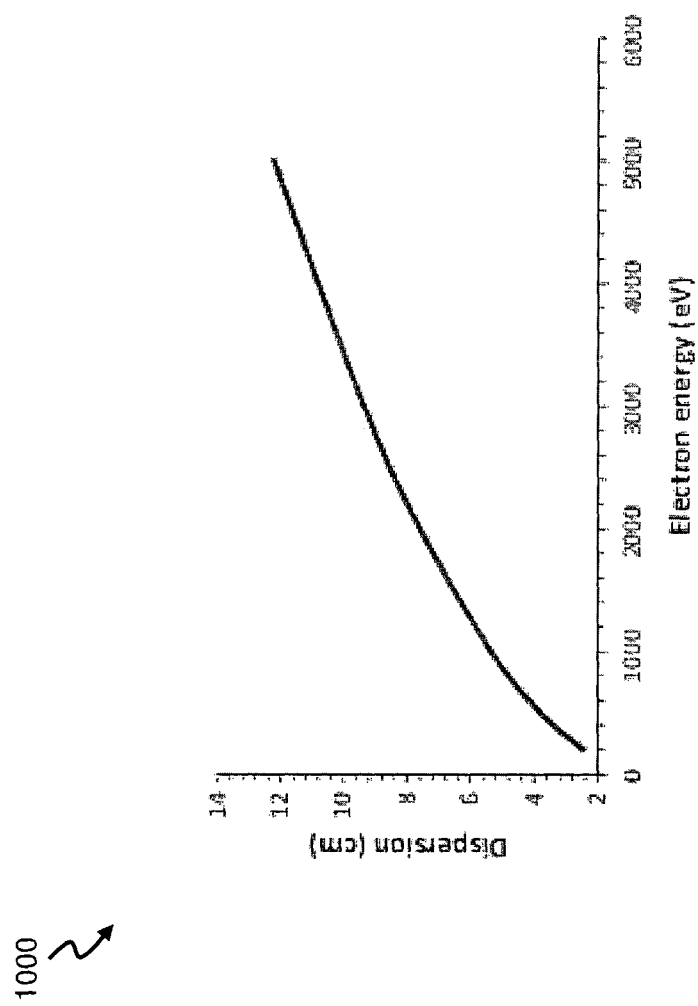
FIG. 8 is a plot illustrating simulated energy dispersion characteristics of the second-order focusing PRMA of FIG. 5a along the detector plane.

FIG. 8 correspondingly depicts, for the second-order PRMA 700, the simulated energy dispersion along the plane of the detector 206 (i.e. the Gaussian focal plane), and shows that the sensitivity of landing position (i.e. the gradient) of the electron rays is greatest for those with lower energies, and gradually reduces with higher energies, becoming approximately linear in the energy range of 2000 eV to 5000 eV.

Advantages of the second-order PRMA 700, over existing designs, include having full rotational symmetric detection capability (for the scattered electrons/ions) with respect to the directed primary beam axis, and there are no restrictions on the azimuthal angular range of the scattered electrons/ions to be detected. In other words, the out-of-plane angular range of detection is 360°, relative to the conventional out-of plane direction. Further, the range of energies detectable by the second-order PRMA 700 varies by a factor of over fifty from 100 eV to 5000 eV, and has second-order focusing properties for all of the electrons/ions that are detected. More specifically, for a polar angular spread of ±3°, the determined energy resolution (of the second-order PRMA 700) at the energy of 100 eV is approximately 0.65%, and approximately less than 0.2% at energies between 300 eV and 5000 eV. Additionally, the second-order PRMA 700 has a transmittance of an order of magnitude better than existing wide-range parallel energy analyzer designs.

The described embodiments should not however be construed as limitative. For example, a high grid transparency (of better than 90%) to be used for the exit grid 728 of the second-order PRMA 700 may be constructed from thin radial wires, and such types of wires have not been determined to be an important factor limiting the energy resolutions of other rotationally symmetric electric analyser designs based on a paper titled "*Electron Optics of Spheroid Charged Particle Energy Analysers*" by D. Cubric, N. Kholine, and I. Konishi, published in Nucl. Instrum. Methods Phys. Res. A 645 (2011), Pages 234-240. In addition, the first-order PRMA 400 or second-order PRMA 700 may also be formed as an integral component within the scanning electron/ion microscope, rather than being implemented as an add-on device attachment.

Furthermore, the first-order PRMA 400 and second-order PRMA 700 are not respectively limited to being configured with only seven electrodes (i.e. the deflection electrodes 402, 404, 406, 408, 410, 412 and main deflector plate 416) or twelve electrodes (i.e. the main deflector plate 726 and deflection electrodes 702, 704, 706, 708, 710, 712, 714, 716, 718, 720, 722). It is to be appreciated that more electrodes, as opposed to the numbers respectively described in the first and second embodiments, may be utilised if necessary, in order to provide better control of the focusing of the electron/ion beams onto the flat plane of the detector 206.

While the invention has been illustrated and described in detail in the drawings and foregoing description, such illustration and description are to be considered illustrative or exemplary, and not restrictive; the invention is not limited to the disclosed embodiments. Other variations to the disclosed embodiments can be understood and effected by those skilled in the art in practising the claimed invention.

The invention claimed is:

1. A parallel radial mirror analyser (PRMA) for facilitating rotationally symmetric detection of charged particles caused by a charged beam incident on a specimen, the PRMA comprising:
   a zero-volt equipotential grid; and
   a plurality of electrodes electrically configured with different biasing potentials to generate corresponding electrostatic fields for deflecting the charged particles to exit through the grid to form corresponding second-order focal points on a horizontal detector,
   wherein the detector is disposed external to the corresponding electrostatic fields and a detector plane of the detector is arranged orthogonal to the rotational axis of symmetry of the PRMA, wherein the grid is positioned at an angle with respect to the detector plane.

2. The PRMA of claim 1, wherein the grid is positioned at an angle of approximately 17° relative to detector plane of the PRMA.

3. The PRMA of claim 1, configured to be mounted to a scanning electron/ion microscope.

4. The PRMA of claim 1, wherein the plurality of electrodes are respectively configured with voltages of −17 V, −88.1 V, −208.3 V, −320.4 V, −480.6 V, −688.9 V, −929.2 V, −1249.6 V, −1441.8 V, −1521.9 V, −1762.2 V, and −2643 V.

5. The PRMA of claim 1, wherein the PRMA includes the detector.

6. The PRMA of claim 1, wherein the detector is arranged around an axis of the charged beam to enable detection of the charged particles omnidirectionally.

7. The PRMA of claim 1, wherein the field strength of the electrostatic fields are configured to configured to achieve an energy resolution of better than 0.2% for an in-plane angular spread of ±3° for a majority of the energy range.

8. The PRMA of claim 1, wherein the grid has a grid transparency of greater than 90%.

9. A scanning electron/ion microscope comprising the PRMA of claim 1.

10. A method of detecting charged particles caused by an electron beam incident on a specimen using the PRMA of claim 1, the method comprises:
    receiving the charged particles;
    generating the corresponding electrostatic fields to deflect the charged particles to exit through the grid; and
    detecting the corresponding second-order focal points formed by the exiting charged particles on the detector.

11. The PRMA of claim 1, wherein the PRMA includes being arranged for wide-energy range detection and the wide-energy range includes a highest energy level of at least 50 times greater than a lowest energy level.

\* \* \* \* \*